United States Patent
Minami

(10) Patent No.: US 9,837,432 B2
(45) Date of Patent: Dec. 5, 2017

(54) SEMICONDUCTOR MEMORY DEVICE

(71) Applicant: Toshiba Memory Corporation, Minato-ku (JP)

(72) Inventor: Koichi Minami, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/045,386

(22) Filed: Feb. 17, 2016

(65) Prior Publication Data

US 2017/0069656 A1 Mar. 9, 2017

Related U.S. Application Data

(60) Provisional application No. 62/216,029, filed on Sep. 9, 2015.

(51) Int. Cl.

| | |
|---|---|
| *H01L 29/76* | (2006.01) |
| *H01L 27/11582* | (2017.01) |
| *H01L 27/11556* | (2017.01) |
| *H01L 23/528* | (2006.01) |
| *H01L 27/11519* | (2017.01) |
| *H01L 27/11565* | (2017.01) |

(52) U.S. Cl.
CPC ...... *H01L 27/11582* (2013.01); *H01L 23/528* (2013.01); *H01L 27/11519* (2013.01); *H01L 27/11556* (2013.01); *H01L 27/11565* (2013.01)

(58) Field of Classification Search
CPC ......... H01L 27/11582; H01L 27/11556; H01L 27/11565; H01L 27/11519

USPC ........................................................ 257/314
See application file for complete search history.

(56) References Cited

U.S. PATENT DOCUMENTS

| 8,154,068 B2 | 4/2012 | Katsumata et al. |
|---|---|---|
| 2012/0156848 A1 | 6/2012 | Yang et al. |
| 2014/0063890 A1* | 3/2014 | Lee .................... H01L 27/11519 365/63 |

OTHER PUBLICATIONS

Combined Taiwanese Office Action and Search Report dated Apr. 10, 2017 in Patent Application No. 105121810 (with English language translation of categories of cited documents).

* cited by examiner

*Primary Examiner* — Anthony Ho
(74) *Attorney, Agent, or Firm* — Oblon, McClelland, Maier & Neustadt, L.L.P.

(57) ABSTRACT

According to one embodiment, a semiconductor memory device includes a substrate, a stacked body, a plurality of pillar portions, and an interconnection portion. The stacked body is provided on the substrate. The stacked body includes a plurality of electrode layers stacked separately from each other. The plurality of pillar portions are provided in the stacked body. The plurality of pillar portions extend in a stacking direction of the stacked body. The interconnection portion is provided in the stacked body. The interconnection portion extends in a first direction. The neighboring pillar portions are not arranged along the first direction.

10 Claims, 11 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/216,029, filed on Sep. 9, 2015; the entire contents of which are incorporated herein by reference.

FIELD

Embodiments described herein relate generally to a semiconductor memory device.

BACKGROUND

A memory device having a three-dimensional structure has been proposed in which memory holes are formed in a stacked body in which plural electrode layers serving as control gates in memory cells are stacked with insulating layers interposed therebetween and a side wall of each memory hole is provided with a silicon body serving as a channel with a charge storage layer interposed therebetween. In the memory device having a three-dimensional structure, there is concern about great warpage of the surface of a wafer due to a stress such as a compressive stress or a tensile stress which is generated in the electrode layers with an increase in the number of electrode layers stacked.

DETAILED DESCRIPTION

Figure 1:
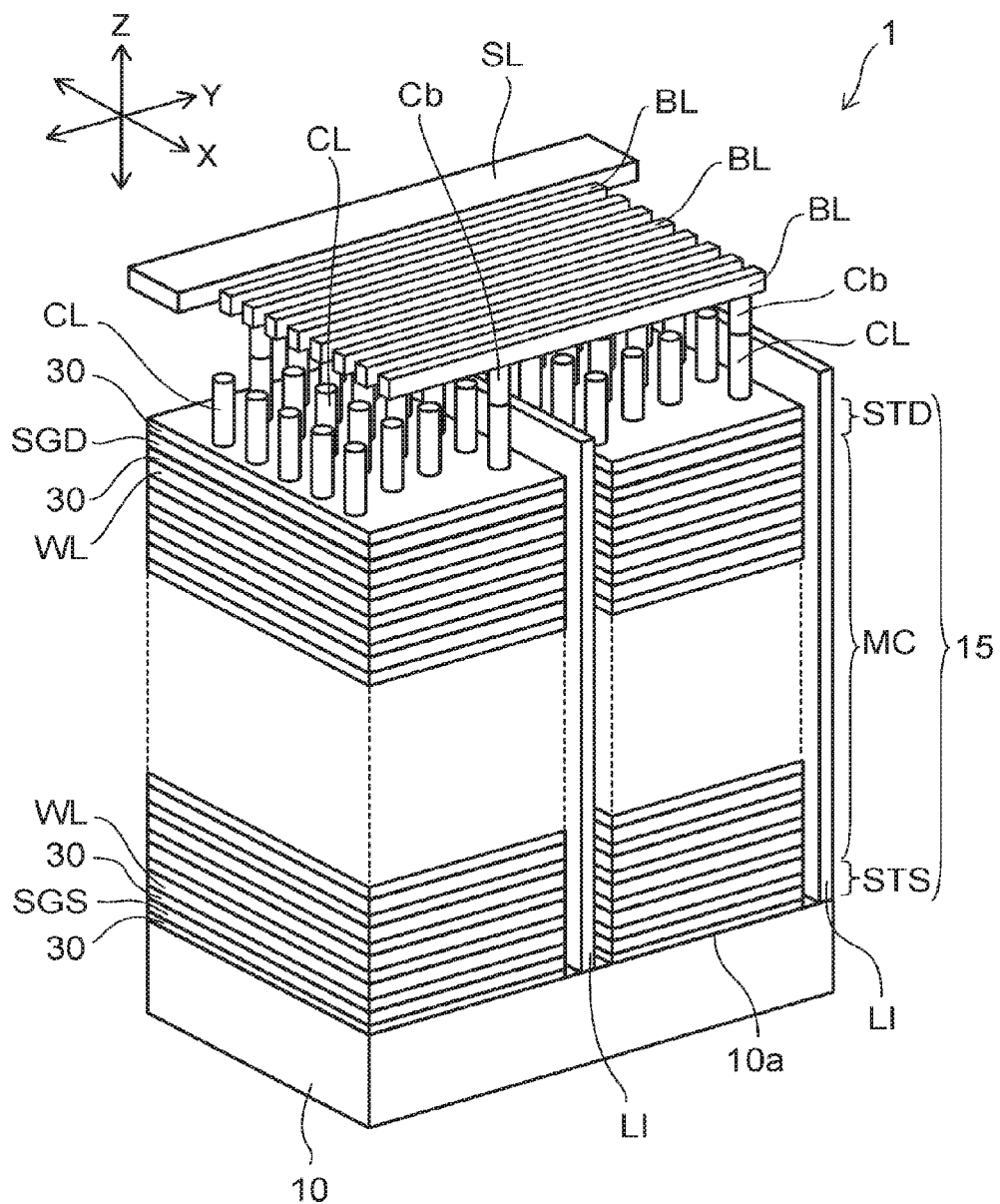
FIG. 1 is a schematic perspective view of a semiconductor memory device according to a first embodiment.

According to one embodiment, a semiconductor memory device includes a substrate, a stacked body, a plurality of pillar portions, and an interconnection portion. The stacked body is provided on the substrate. The stacked body includes a plurality of electrode layers stacked separately from each other. The plurality of pillar portions are provided in the stacked body. The plurality of pillar portions extend in a stacking direction of the stacked body. The interconnection portion is provided in the stacked body. The interconnection portion extends in a first direction. The neighboring pillar portions are not arranged along the first direction.

Embodiments will now be described with reference to the drawings. The same components in the drawings are marked with the same reference numerals.

A semiconductor memory device that has a three-dimensional structure will now be described as an example.

First Embodiment

FIG. 1 is a schematic perspective view of a semiconductor memory device according to a first embodiment.

Figure 2:
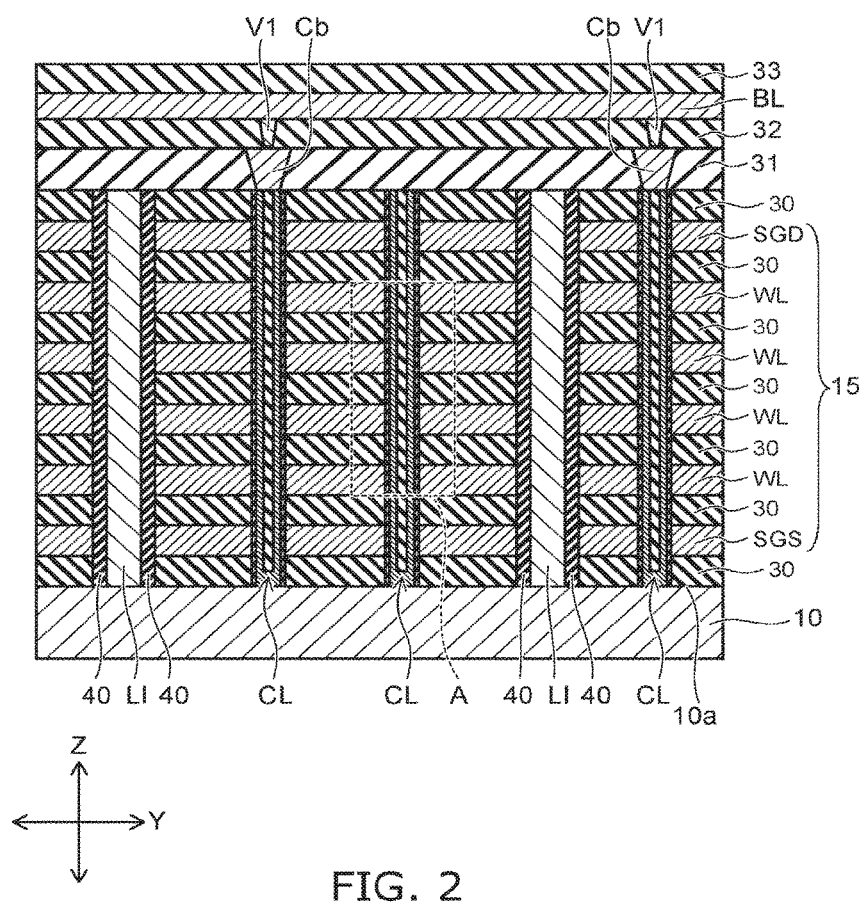
FIG. 2 is a schematic cross-sectional view of the semiconductor memory device according to the first embodiment.

FIG. 2 is a schematic cross-sectional view of the semiconductor memory device according to the first embodiment.

Figure 3:
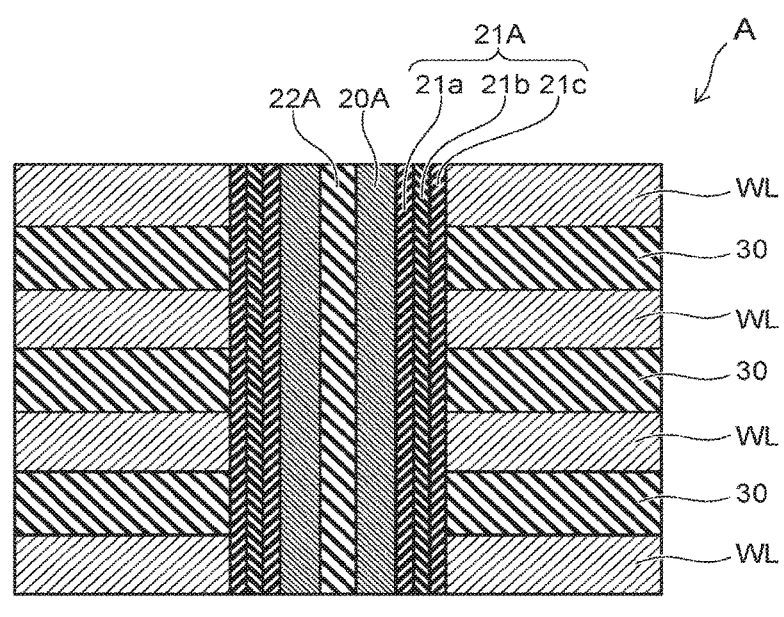
FIG. 3 is an enlarged view of region A in FIG. 2.
Figure 3:
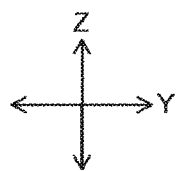

FIG. 3 is an enlarged view of region A in FIG. 2.

FIG. 1 shows a memory cell array of a semiconductor memory device 1. FIG. 2 and FIG. 3 show cross-sectional views of the memory cell array.

In FIG. 1, an insulating layer 31, an insulating layer 32, an insulating layer 33, and a contact portion V1 are not illustrated. In FIG. 1, two directions which are parallel to a top surface 10a of a substrate 10 and which are perpendicular to each other are defined as an X-direction and a Y-direction and a direction perpendicular to both the X-direction and the Y-direction is defined as a Z-direction. The Z-direction is a stacking direction.

As shown in FIG. 1 and FIG. 2, a stacked body 15 is provided on the substrate 10 with an insulating layer 30 interposed therebetween. The stacked body 15 includes plural electrode layers WL, plural insulating layers 30, a source-side selection gate SGS, and a drain-side selection gate SGD. The plural electrode layers WL are stacked separately from each other and the plural insulating layers 30 are provided between the plural electrode layers WL. The plural electrode layers WL and the plural insulating layers 30 are alternately stacked, for example, layer by layer. The number of electrode layers WL illustrated in the drawing is an example, and the number of electrode layers WL is arbitrary.

The lowest layer of the stacked body 15 is provided with the source-side selection gate SGS. The highest layer of the stacked body 15 is provided with the drain-side selection gate SGD. The insulating layer 30 is provided on the stacked body 15.

The plural electrode layers WL are formed of, for example, any of metal, metal silicide, and polysilicon. The source-side selection gate SGS and the drain-side selection gate SGD may contain a material equal to or different from the material of the above-mentioned plural electrode layers WL. For example, an insulating layer containing silicon oxide is used as the insulating layer 30, the insulating layer 31, the insulating layer 32, and the insulating layer 33.

A pillar portion CL extending in the Z-direction is provided in the stacked body 15. The pillar portion CL is provided, for example, in a cylinder shape or an elliptic cylinder shape. The detailed arrangement of the pillar portion CL will be described later.

As illustrated in FIG. 3, the pillar portion CL includes a channel body 20A (semiconductor portion), a memory film 21A, and a core insulating portion 22A. The channel body 20A is, for example, a silicon film.

The memory film 21A is provided between the stacked body 15 and the channel body 20A. In the memory film 21A, a tunnel insulating layer 21a, a charge storage layer 21b, and a block insulating layer 21c are sequentially stacked from the channel body 20A. The tunnel insulating layer 21a is a layer which is normally insulative but in which a tunnel current flows when a predetermined voltage within a drive voltage range of the semiconductor memory device 1 is applied thereto. The charge storage layer 21b is a layer in which charge is stored and, for example, a layer including silicon nitride is used. The block insulating layer 21c is a layer in which a current does not substantially flow even when a voltage within a drive voltage range of the semiconductor memory device 1 is applied thereto and is an oxide layer formed of a high-dielectric material such as silicon oxide, aluminum oxide, or hafnium oxide or a multi-layer film in which the oxide layers are stacked. The memory film 21A may be configured to include a floating gate. For example, the memory film 21A may be formed by digging in the electrode layer WL and embedding a floating gate therein.

The core insulating portion 22A is provided inside the channel body 20A. The core insulating portion 22A may include, for example, a silicon oxide film and an air gap. The core insulating portion 22A may not be provided inside the channel body 20A.

An interconnection portion LI extending in the X-direction and the Z-direction in the stacked body 15 is provided in the stacked body 15. The interconnection portion LI is electrically connected to a source line SL thereon via a contact (not illustrated). The interconnection portion LI is formed of a metal material such as tungsten. The interconnection portion LI includes a plate-like portion parallel to the XZ plane. For example, the interconnection portion LI may be formed by connecting plural plate-like portions to each other. For example, in FIG. 1, two plate-like portions of the interconnection portion LI may be connected to each other.

A side wall of the interconnection portion LI is provided with an insulating film 40. The insulating film 40 extends in the X-direction and the Z-direction similarly to the interconnection portion LI. For example, a film including silicon oxide is used as the insulating film 40. The interconnection portion LI is electrically connected to the pillar portion CL on the bottom surface thereof.

A contact portion Cb is provided at an upper end of the channel body 20A. A contact portion V1 is provided on the contact portion Cb. The contact portion V1 is thinner than the contact portion Cb. The contact portion Cb and the contact portion V1 are formed, for example, as a contact plug by stacking metal-containing layers such as a tungsten layer and a titanium nitride layer.

Plural bit lines BL are provided on the contact portion V1. The plural bit lines BL are separated in the X-direction and extend in the Y-direction. The plural bit lines BL are formed of, for example, a metal film. The upper end of the channel body 20A is connected to the bit lines BL via the contact portion Cb and the contact portion V1.

Plural pillar portions CL (the channel bodies 20A) individually selected from regions separated in the Y-direction are connected to a common bit line BL. Each bit line BL is connected to one pillar portion CL provided in the stacked body 15 divided into predetermined blocks via one contact portion V1 and one contact portion Cb.

Here, a "block" corresponds to a part between neighboring interconnection portions LI. For example, four columns of pillar portions including plural pillar portions CL are disposed in each block. Each bit line BL extends in the Y-direction over plural blocks and is connected to one pillar portion CL for each block.

A drain-side selection transistor STD is formed at the upper end of the pillar portion CL and a source-side selection transistor STS is formed at the lower end thereof. The memory cells MC, the drain-side selection transistor STD, and the source-side selection transistor STS are vertical transistors in which a current flows in the stacking direction (Z-direction) of the stacked body 15.

The above-mentioned selection gates SGD and SGS serve as gate electrodes (control gates) of the selection transistors STD and STS, respectively. The memory films 21A serving as gate insulating films of the selection transistors STD and STS are provided between the selection gates SGD and SGS and the channel bodies 20A.

Plural memory cells MC having the respective electrode layers WL as control gates are provided between the drain-side selection transistor STD and the source-side selection transistor STS.

The plural memory cells MC, the drain-side selection transistor STD, and the source-side selection transistor STS are connected in series via the channel bodies 20A to constitute a memory string. The memory strings are arranged, for example, in a zigzag lattice pattern in an in-plane direction parallel to the XY plane, whereby plural memory cells MC are three-dimensionally arranged in the X-direction, the Y-direction, and the Z-direction.

The semiconductor memory device 1 according to this embodiment can freely electrically erase and write data and can retain memory details even when a power supply is turned off.

Hereinafter, the arrangement of the pillar portions CL will be described below.

Figure 4:
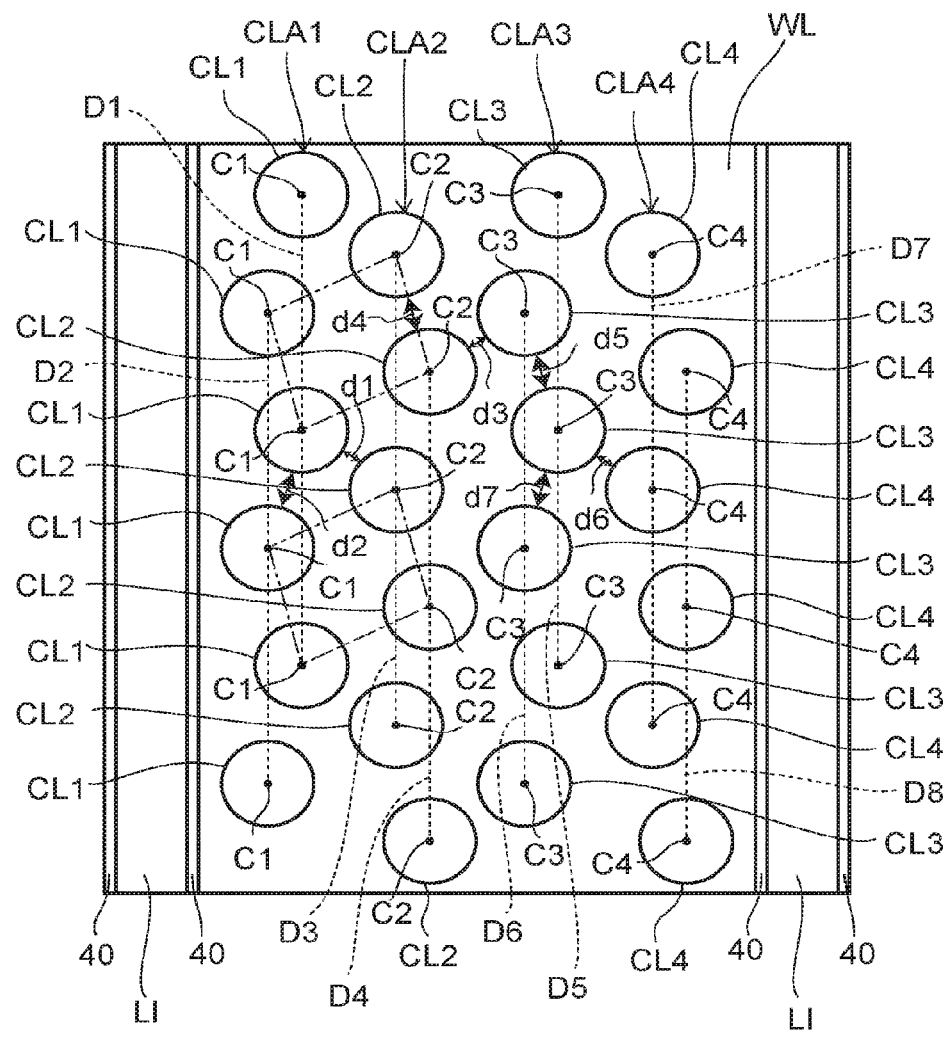
FIG. 4 is a schematic plan view of the semiconductor memory device according to the first embodiment.

FIG. 4 is a schematic plan view of the semiconductor memory device according to the first embodiment.

Figure 5:
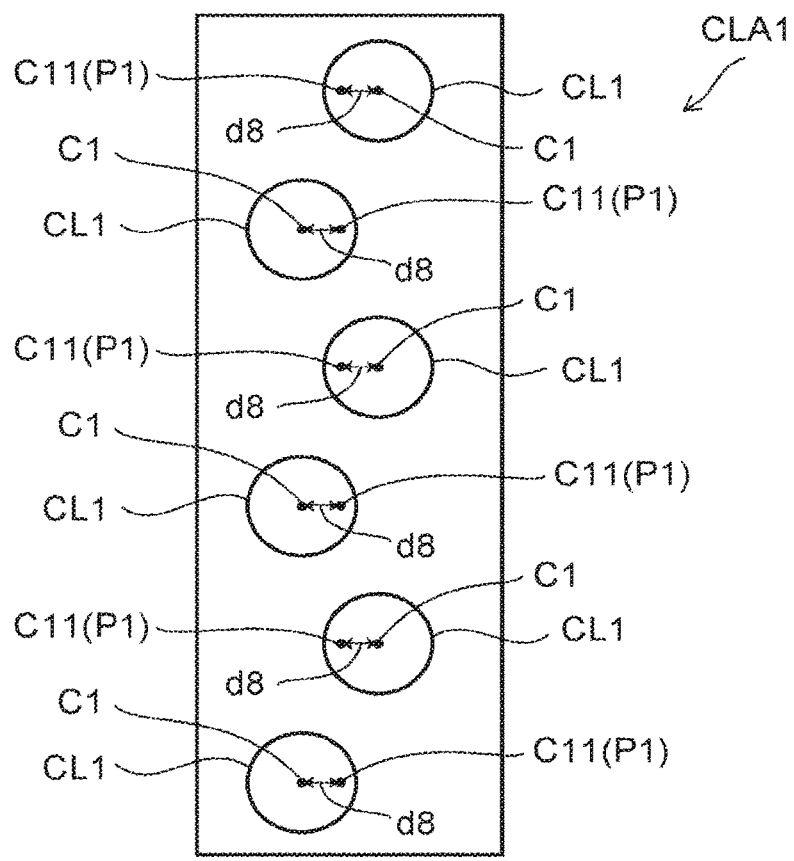
FIG. 5 is a diagram illustrating a part of FIG. 4.

FIG. 5 is a diagram illustrating a part of FIG. 4.

Figure 6:
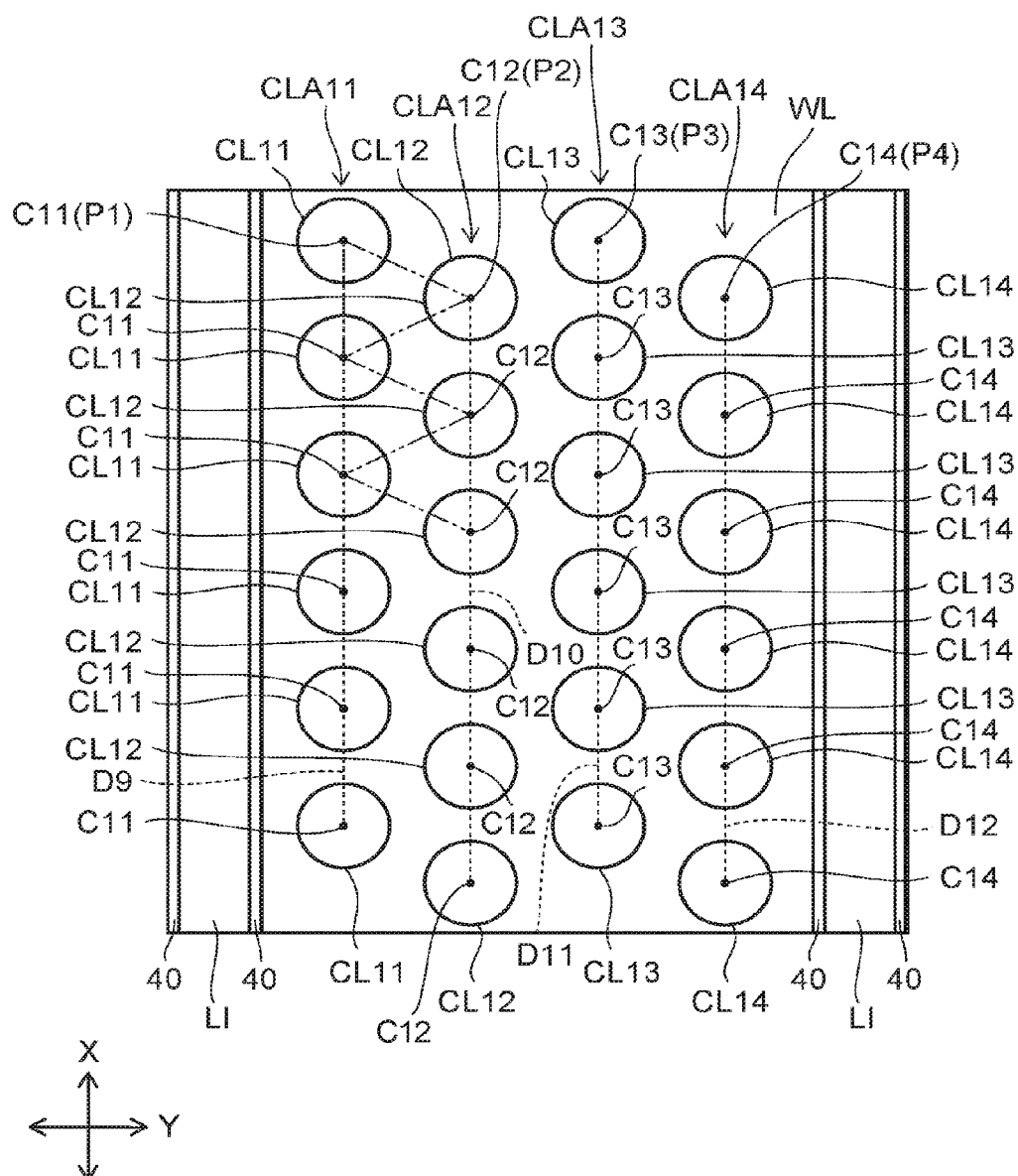
FIG. 6 is a plan view of a semiconductor memory device according to a reference example.

FIG. 6 is a plan view of a semiconductor memory device according to a reference example.

FIG. 4 is a top view of a memory cell array and is a diagram illustrating the arrangement of pillar portions CL1 to CL4 of an electrode layer WL. FIG. 5 is a diagram illustrating a first column CLA1 including plural pillar portions CL1. FIG. 6 is a top view of a memory cell array and is a reference diagram illustrating the arrangement of pillar portions CL11 to CL14 of an electrode layer WL.

As illustrated in FIG. 4, a first column CLA1 which is a column of plural pillar portions CL1, a second column CLA2 which is a column of plural pillar portions CL2, a third column CLA3 which is a column of plural pillar portions CL3, and a fourth column CLA4 which is a column of plural pillar portions CL4 are formed in the electrode layer WL. In FIG. 4, four columns of the first to fourth columns CLA1 to CLA4 are formed on the electrode layer WL, and the number of columns is arbitrary. For example, n (where n is an integer satisfying 2≤n≤18) columns of pillar portions CL can be formed. For example, when columns of pillar portions CL are formed, the first to fourth columns CLA1 to CLA4 can be repeatedly formed.

When straight lines parallel to the X-direction are formed in the electrode layer WL, odd-numbered pillar portions CL1 of the first column CLA1 are located on the straight line D1 parallel to the X-direction. Even-numbered pillar portions CL1 of the first column CLA1 are located on the straight line D2 parallel to the X-direction. Odd-numbered pillar portions CL2 of the second column CLA2 are located on the straight line D3 parallel to the X-direction. Even-numbered pillar portions CL2 of the second column CLA2 are located on the straight line D4 parallel to the X-direction. Odd-numbered pillar portions CL3 of the third column CLA3 are located on the straight line D5 parallel to the X-direction. Even-numbered pillar portions CL3 of the third column CLA3 are located on the straight line D6 parallel to the X-direction. Odd-numbered pillar portions CL4 of the fourth column CLA4 are located on the straight line D7 parallel to the X-direction. Even-numbered pillar portions CL4 of the fourth column CLA4 are located on the straight line D8 parallel to the X-direction. It is assumed that the pillar portions CL1 to CL4 of the first to fourth columns CLA1 to CLA4 are sequentially arranged from the +X side to the −X side.

In the neighboring pillar portions CL, a distance d1 between a pillar portion CL1 disposed on the straight line D1 and a pillar portion CL2 disposed on the straight line D3 is less than a distance d2 between a pillar portion CL1 disposed on the straight line D1 and a pillar portion CL1 disposed on the straight line D2. In the neighboring pillar portions CL, a distance d3 between a pillar portion CL2 disposed on the straight line D4 and a pillar portion CL3 disposed on the straight line D6 is less than a distance d4 between a pillar portion CL2 disposed on the straight line D4 and a pillar portion CL2 disposed on the straight line D3 or a distance d5 between a pillar portion CL3 disposed on the straight line D6 and a pillar portion CL3 disposed on the straight line D5. In the neighboring pillar portions CL, a distance d6 between a pillar portion CL3 disposed on the straight line D5 and a pillar portion CL4 disposed on the straight line D7 is less than a distance d7 between a pillar portion CL3 disposed on the straight line D5 and a pillar portion CL3 disposed on the straight line D6. The distances d1 to d7 correspond to distances which are determined by straight lines connecting the centers of the pillar portions. The "neighboring pillar portions CL" correspond to a pillar portion CL and a pillar portion CL previous or subsequent to the pillar portion CL in the same column as the pillar portion CL. The "neighboring pillar portions CL" correspond to a pillar portion CL and a pillar portion CL which is arranged in the previous or subsequent column to the column of the pillar portion CL and which is closest to the pillar portion CL.

The odd-numbered pillar portions CL2 arranged in the second column CLA2 will be exemplified. The neighboring pillar portions CL correspond to an odd-numbered pillar portion CL2 of the second column CLA2 and an even-numbered pillar portion CL2 which is previous or subsequent to the odd-numbered pillar portion CL2. The neighboring pillar portions CL correspond to an odd-numbered pillar portion CL2 of the second column CLA2 and a pillar portion CL1 of the first column CLA1 which is separated by the distance d1 from the odd-numbered pillar portion CL2.

The centers C1 of the pillar portions CL1 of the first column CLA1 are not located on the same straight line parallel to the X-direction. The centers C2 of the pillar portions CL2 of the second column CLA2 are not located on the same straight line parallel to the X-direction. The centers C3 of the pillar portions CL3 of the first column CLA3 are not located on the same straight line parallel to the X-direction. The centers C4 of the pillar portions CL4 of the first column CLA4 are not located on the same straight line parallel to the X-direction. For example, the pillar portions CL1 to CL4 are arranged in a zigzag pattern in the X-direction. The pillar portions CL1 to CL4 are periodically arranged in a rhombic lattice pattern.

The centers C1 of the odd-numbered pillar portions CL1 of the first column CLA1 are points which are biased in the +Y-direction from reference points P1 located on the electrode layer WL. The centers C1 of the even-numbered pillar portions CL1 of the first column CLA1 are points which are biased in the −Y-direction from reference points P1 located on the electrode layer WL. The centers C2 of the odd-numbered pillar portions CL2 of the second column CLA2 are points which are biased in the −Y-direction from reference points P2 located on the electrode layer WL. The centers C2 of the even-numbered pillar portions CL2 of the second column CLA2 are points which are biased in the +Y-direction from reference points P2 located on the electrode layer WL. The centers C3 of the odd-numbered pillar portions CL3 of the third column CLA3 are points which are biased in the +Y-direction from reference points P3 located on the electrode layer WL. The centers C3 of the even-numbered pillar portions CL3 of the third column CLA3 are points which are biased in the −Y-direction from reference points P3 located on the electrode layer WL. The centers C4 of the odd-numbered pillar portions CL4 of the fourth column CLA4 are points which are biased in the −Y-direction from reference points P4 located on the electrode layer WL. The centers C4 of the even-numbered pillar portions CL4 of the fourth column CLA4 are points which are biased in the +Y-direction from reference points P4 located on the electrode layer WL.

A setting example of the reference points P1 to P4 will be described below.

As illustrated in FIG. 6, a first column CLA11 which is a column of plural pillar portions CL11 arranged in the X-direction, a second column CLA12 which is a column of plural pillar portions CL12 arranged in the X-direction, a third column CLA13 which is a column of plural pillar portions CL13, and a fourth column CLA14 which is a column of plural pillar portions CL14 are formed. When straight lines parallel to the X-direction are formed in the electrode layer WL, centers C11 of the pillar portions CL11 of the first column CLA11 are located on a straight line D9 parallel to the X-direction. Centers C12 of the pillar portions CL12 of the second column CLA12 are located on a straight line D10 parallel to the X-direction. Centers C13 of the pillar portions CL13 of the third column CLA13 are located on a straight line D11 parallel to the X-direction. Centers C14 of the pillar portions CL14 of the first column CLA14 are located on a straight line D12 parallel to the X-direction. It is assumed that the pillar portions CL11 to CL14 of the first to fourth columns CLA11 to CLA14 are sequentially disposed from the +X-direction to the −X-direction.

In the arrangement of the pillar portions CL11 to CL14 illustrated in FIG. 6, the close-packed arrangement direction includes three directions of the Y-direction and two directions inclined by ±30° about the Y-direction. The pillar portions CL11 to CL14 are periodically arranged in a regular triangular lattice pattern. In this case, intersections at which plural regular triangles intersect each other correspond to the centers C11 to C14.

For example, when reference points P1 to P4 are set to intersections of lattice bodies, the reference points P1 to P4 correspond to the centers C11 to C14. For example, the center C11 corresponding to the reference point P1 is located in the direction inclined by 30° about the −Y-direction from the center C12 corresponding to the reference point P2. The center C13 corresponding to the reference point P3 is located in the direction inclined by 30° about the +Y-direction from the center C12 corresponding to the reference point P2. The center C14 corresponding to the reference point P4 is located in the +Y-direction from the center C12 corresponding to the reference point P2.

When the reference points P1 to P4 are set in this way, the centers C1 of the odd-numbered pillar portions CL1 of the first column CLA1 in FIG. 4 are points which are biased in the +Y-direction from the centers C11 of the odd-numbered pillar portions CL11 of the first column CLA11 in FIG. 6.

The centers C1 of the even-numbered pillar portions CL1 of the first column CLA1 are points which are biased in the −Y-direction from the centers C11 of the even-numbered pillar portions CL11 of the first column CLA11 in FIG. 6.

In FIG. 4, the centers C2 of the odd-numbered pillar portions CL2 of the second column CLA2 are points which are biased in the −Y-direction from the centers C12 of the odd-numbered pillar portions CL12 of the second column CLA12 in FIG. 6. The centers C2 of the even-numbered pillar portions CL2 of the second column CLA2 are points which are biased in the +Y-direction from the centers C12 of the even-numbered pillar portions CL12 of the second column CLA12 in FIG. 6.

In FIG. 4, the centers C3 of the odd-numbered pillar portions CL3 of the third column CLA3 are points which are biased in the +Y-direction from the centers C13 of the odd-numbered pillar portions CL13 of the third column CLA13 in FIG. 6. The centers C3 of the even-numbered pillar portions CL3 of the third column CLA3 are points which are biased in the −Y-direction from the centers C13 of the even-numbered pillar portions CL13 of the third column CLA13 in FIG. 6.

In FIG. 4, the centers C4 of the odd-numbered pillar portions CL4 of the fourth column CLA4 are points which are biased in the −Y-direction from the centers C14 of the odd-numbered pillar portions CL14 of the fourth column CLA14 in FIG. 6. The centers C4 of the even-numbered pillar portions CL4 of the fourth column CLA4 are points which are biased in the +Y-direction from the centers C14 of the even-numbered pillar portions CL14 of the fourth column CLA14 in FIG. 6.

The distances from the reference points P1 to P4 to the centers C1 to C4 of the pillar portions CL1 to CL4 are arbitrary. For example, as illustrated in FIG. 5, in the first column CLA1, the centers C1 of the odd-numbered pillar portions CL1 can be located while being biased by the distance d8 in the +Y-direction from the centers C11 (reference points P1) and the centers C1 of the even-numbered pillar portions CL1 can be located while being biased by the distance d8 in the −Y-direction from the centers C11 (reference points P1). In the second to fourth columns CLA2 to CLA4, the centers C2 to C4 can be located while being biased by the distance d8 in the +Y-direction or the −Y-direction from the centers C12 to C14 (reference points P2 to P4). The distance in the +Y-direction and the distance in the −Y-direction may be different from each other. Without being limited to the +Y-direction or the −Y-direction, the centers C1 to C4 of the pillar portions CL1 to CL4 may be biased in a predetermined direction from the reference points P1 to P4.

The above-mentioned setting of the reference points P1 to P4 is an example. Arbitrary points on the electrode layer WL can be set as the reference points P1 to P4.

In this embodiment, the centers C1 to C4 of the pillar portions CL1 to CL4 are located so as to be biased in a predetermined direction (for example, in the +Y-direction or the −Y-direction) from the reference points P1 to P4. Accordingly, the pillar portions CL1 to CL4 are not located along the X-direction. That is, the first to fourth columns CLA1 to CLA4 are not formed along the X-direction.

Effects of this embodiment will be described below.

When the pillar portions CL11 to CL14 are disposed on the electrode layer WL so as to locate the centers C11 to C14 on the straight lines parallel to the X-direction as illustrated in FIG. 6, a stress such as a compressive stress or a tensile stress is generated on one surface of the substrate 10, deformation of the substrate 10 increases, and the substrate 10 greatly warps. In a semiconductor memory device having a three-dimensional structure, the larger the number of electrode layers WL becomes, the more easily the stress is applied in one direction. Accordingly, the warpage of the substrate 10 increases. Plural semiconductor memory devices are fabricated by forming a structure on a wafer including the substrate 10 and dicing the wafer and the structure. As a result, such great warpage degrades accuracy in fabrication processes, hinders stable operations of fabrication equipment, and thus causes warpage or cracking of the wafer.

On the other hand, as in this embodiment, when the pillar portions CL1 to CL4 are disposed so as not to locate the centers C1 to C4 on the straight line parallel to the X-direction, an X-direction component of the stress generated in the electrode layer WL can be interrupted. Accordingly, since the stress generated in the electrode layers WL can be reduced, the warpage of the substrate 10 can be suppressed, thereby suppressing warpage or cracking of the wafer.

Second Embodiment

Figure 7:
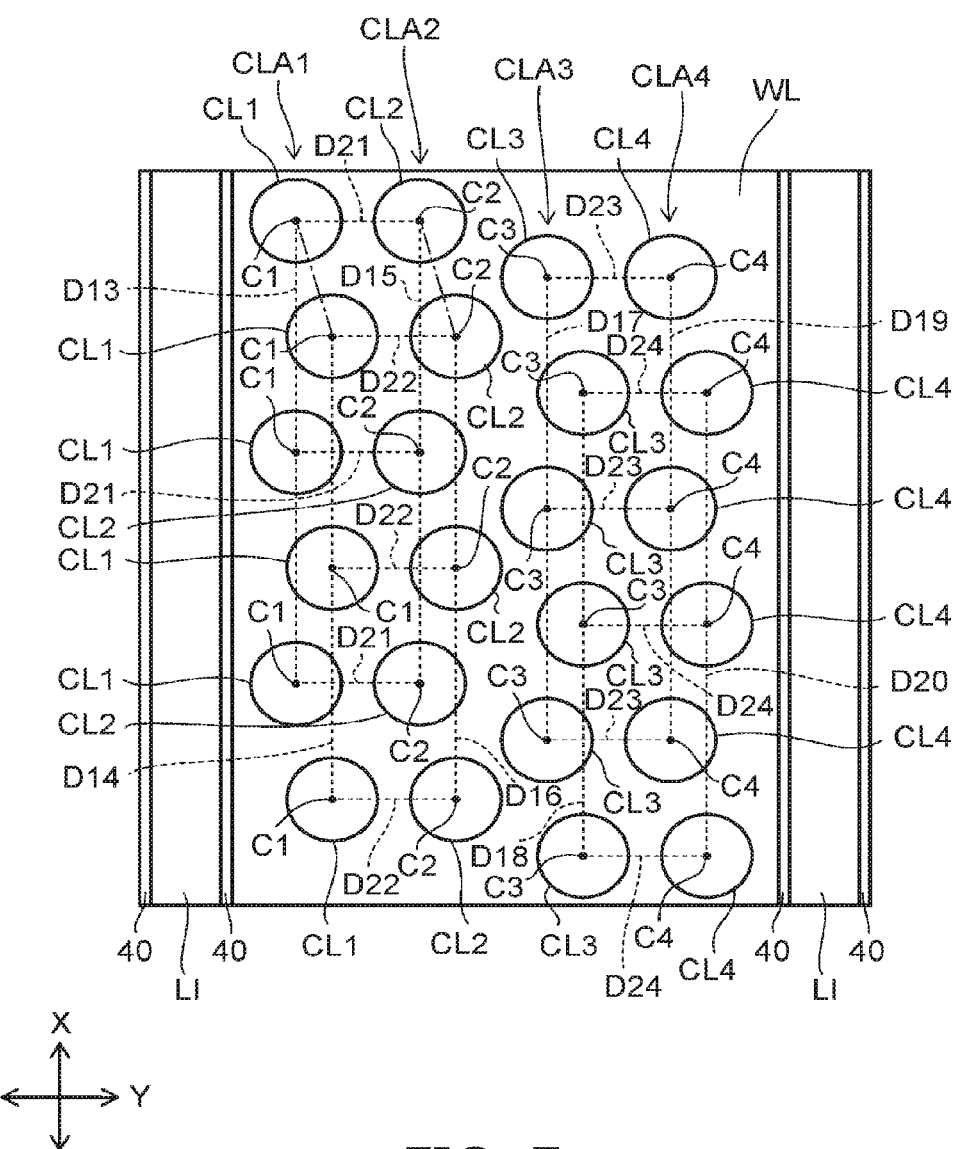
FIG. 7 is a schematic plan view of a semiconductor memory device according to a second embodiment.

FIG. 7 is a schematic plan view of a semiconductor memory device according to a second embodiment.

FIG. 7 is a top view of a memory cell array and is a diagram illustrating an arrangement of pillar portions CL1 to CL4 on an electrode layer WL.

This embodiment is different from the first embodiment in the arrangement of the pillar portions CL1 to CL4 on the electrode layer WL. The other configuration in this embodiment is the same as in the first embodiment.

As illustrated in FIG. 7, a first column CLA1 which is a column of plural pillar portions CL1, a second column CLA2 which is a column of plural pillar portions CL2, a third column CLA3 which is a column of plural pillar portions CL3, and a fourth column CLA4 which is a column of plural pillar portions CL4 are formed in the electrode layer WL. In FIG. 7, four columns of the first to fourth columns CLA1 to CLA4 are formed on the electrode layer WL, but the number of columns is not limited to four. For example, 2n (where n is an integer satisfying $1 \leq n \leq 9$) columns of pillar portions CL can be formed.

When straight lines parallel to the X-direction are formed in the electrode layer WL, odd-numbered pillar portions CL1 of the first column CLA1 are located on the straight line D13 parallel to the X-direction. Even-numbered pillar portions CL1 of the first column CLA1 are located on the straight line D14 parallel to the X-direction. Odd-numbered pillar portions CL2 of the second column CLA2 are located on the straight line D15 parallel to the X-direction. Even-numbered pillar portions CL2 of the second column CLA2 are located on the straight line D16 parallel to the X-direction. Odd-numbered pillar portions CL3 of the third column CLA3 are located on the straight line D17 parallel to the X-direction. Even-numbered pillar portions CL3 of the third column CLA3 are located on the straight line D18 parallel to the X-direction. Odd-numbered pillar portions CL4 of the fourth column CLA4 are located on the straight line D19 parallel to the X-direction. Even-numbered pillar portions CL4 of the fourth column CLA4 are located on the straight line D20 parallel to the X-direction. It is assumed that the pillar portions CL1 to CL4 of the first to fourth columns CLA1 to CLA4 are sequentially disposed from the +X side to the −X side.

The odd-numbered pillar portions CL1 of the first column CLA1 and the odd-numbered pillar portions CL2 of the second column CLA2 are located on the straight line D21 parallel to the Y-direction. The even-numbered pillar portions CL1 of the first column CLA1 and the even-numbered pillar portions CL2 of the second column CLA2 are located on the straight line D22 parallel to the Y-direction. The odd-numbered pillar portions CL3 of the third column CLA3 and the odd-numbered pillar portions CL4 of the fourth column CLA4 are located on the straight line D23 parallel to the Y-direction. The even-numbered pillar portions CL3 of the third column CLA3 and the even-numbered pillar portions CL4 of the fourth column CLA4 are located on the straight line D24 parallel to the Y-direction. For example, the straight line D24, the straight line D22, the straight line D23, and the strait line D21 are sequentially arranged from the −X side to the +X side. For example, when columns of pillar portions CL are formed, the first to fourth columns CLA1 to CLA4 can be repeatedly formed.

The centers C1 of the pillar portions CL1 of the first column CLA1 are not located on the same straight line parallel to the X-direction. The centers C2 of the pillar portions CL2 of the second column CLA2 are not located on the same straight line parallel to the X-direction. The centers C3 of the pillar portions CL3 of the third column CLA3 are not located on the same straight line parallel to the X-direction. The centers C4 of the pillar portions CL4 of the fourth column CLA4 are not located on the same straight line parallel to the X-direction. For example, the pillar portions CL1 to CL4 are arranged in a zigzag pattern in the X-direction. The pillar portions CL1 to CL4 are arranged periodically in a rhombic lattice pattern.

In this embodiment, the pillar portions CL1 to CL4 are not arranged along the X-direction. That is, the first to fourth columns CLA11 to CLA14 are not formed along the X-direction.

Effects of this embodiment will be described below.

As described above in this embodiment, when the pillar portions CL1 to CL4 are disposed so as not to locate the centers C1 to C4 on the straight lines parallel to the X-direction, the X-direction component of a stress such as a compressive stress or a tensile stress generated in the electrode layer WL can be interrupted. Accordingly, since the stress generated in the electrode layers WL can be reduced, it is possible to suppress the warpage of the substrate 10, thereby suppressing warpage or cracking of the wafer.

Third Embodiment

Figure 8:
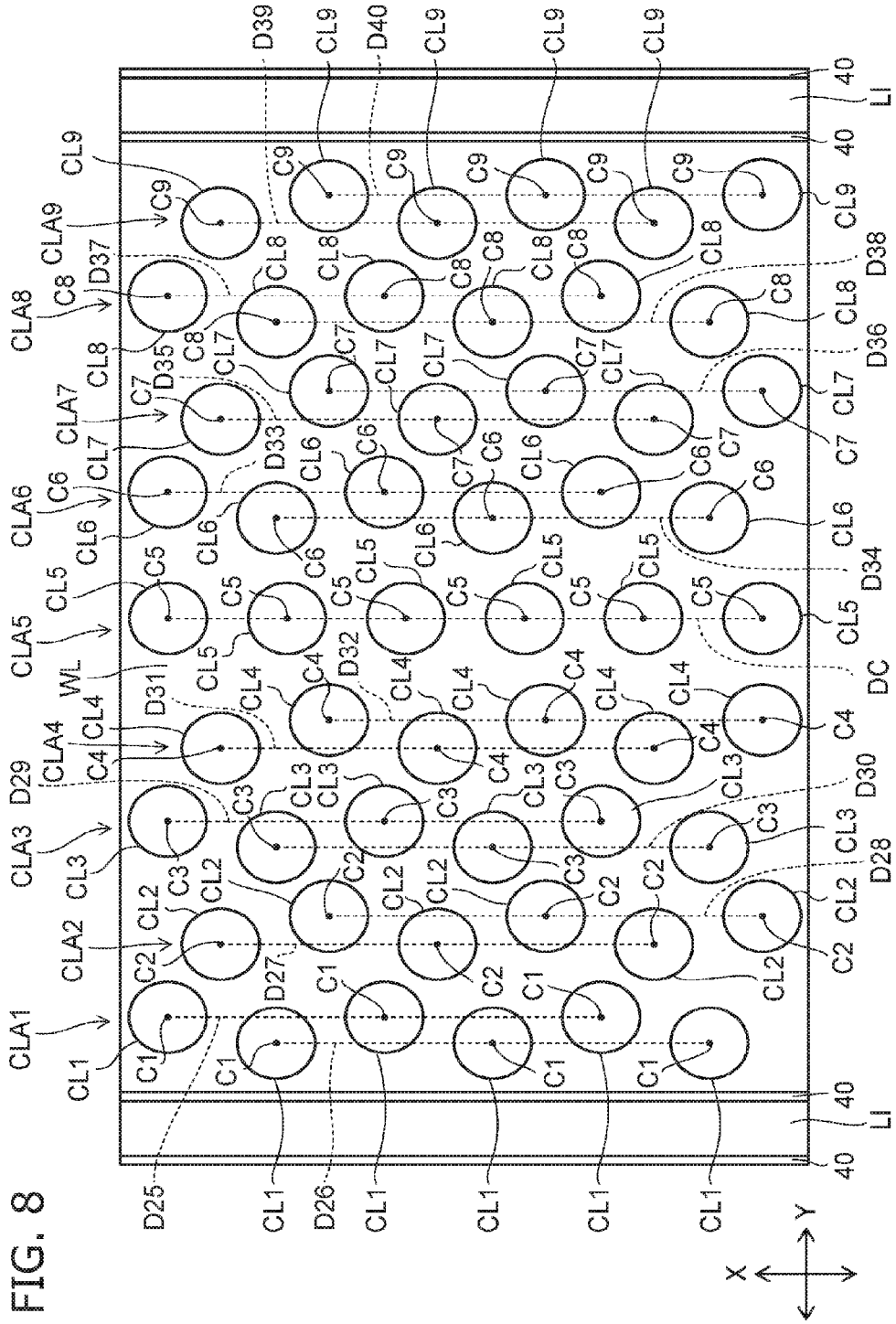
FIG. 8 is a schematic plan view of a semiconductor memory device according to a third embodiment.

FIG. 8 is a schematic plan view of a semiconductor memory device according to a third embodiment.

FIG. 8 is a top view of a memory cell array and is a diagram illustrating an arrangement of pillar portions CL1 to CL9 on an electrode layer WL.

This embodiment describes an example in which the pillar portions CL1 to CL9 are arranged on the electrode layer WL by repeating the arrangement of the pillar portions CL1 to CL4 in the first embodiment.

As illustrated in FIG. 8, a first column CLA1 which is a column of plural pillar portions CL1, a second column CLA2 which is a column of plural pillar portions CL2, a third column CLA3 which is a column of plural pillar portions CL3, a fourth column CLA4 which is a column of plural pillar portions CL4, a fifth column CLA5 which is a column of plural pillar portions CL5, a sixth column CLA6 which is a column of plural pillar portions CL6, a seventh column CLA7 which is a column of plural pillar portions CL7, an eighth column CLA8 which is a column of plural pillar portions CL8, and a ninth column CLA9 which is a column of plural pillar portions CL9 are formed in the electrode layer WL.

Arrangements of the pillar portions CL1 to CL4 and the pillar portions CL6 to CL9 will be described below.

When straight lines parallel to the X-direction are formed in the electrode layer WL, odd-numbered pillar portions CL1 of the first column CLA1 are located on the straight line D25 parallel to the X-direction. Even-numbered pillar portions CL1 of the first column CLA1 are located on the straight line D26 parallel to the X-direction. Odd-numbered pillar portions CL2 of the second column CLA2 are located on the straight line D27 parallel to the X-direction. Even-numbered pillar portions CL2 of the second column CLA2 are located on the straight line D28 parallel to the X-direction. Odd-numbered pillar portions CL3 of the third column CLA3 are located on the straight line D29 parallel to the X-direction. Even-numbered pillar portions CL3 of the third column CLA3 are located on the straight line D30 parallel to the X-direction. Odd-numbered pillar portions CL4 of the fourth column CLA4 are located on the straight line D31 parallel to the X-direction. Even-numbered pillar portions CL4 of the fourth column CLA4 are located on the straight line D32 parallel to the X-direction. It is assumed that the pillar portions CL1 to CL4 of the first to fourth columns CLA1 to CLA4 are sequentially disposed from the +X side to the −X side.

Odd-numbered pillar portions CL6 of the sixth column CLA6 are located on the straight line D33 parallel to the X-direction. Even-numbered pillar portions CL6 of the sixth column CLA6 are located on the straight line D34 parallel to the X-direction. Odd-numbered pillar portions CL7 of the seventh column CLA7 are located on the straight line D35 parallel to the X-direction. Even-numbered pillar portions CL7 of the seventh column CLA7 are located on the straight line D36 parallel to the X-direction. Odd-numbered pillar portions CL8 of the eighth column CLA8 are located on the straight line D37 parallel to the X-direction. Even-numbered pillar portions CL8 of the eighth column CLA8 are located on the straight line D38 parallel to the X-direction. Odd-numbered pillar portions CL9 of the ninth column CLA9 are located on the straight line D39 parallel to the X-direction. Even-numbered pillar portions CL9 of the ninth column CLA9 are located on the straight line D40 parallel to the X-direction. It is assumed that the pillar portions CL6 to CL9 of the sixth to ninth columns CLA6 to CLA9 are sequentially disposed from the +X side to the −X side.

The centers C1 of the pillar portions CL1 of the first column CLA1 are not located on the same straight line parallel to the X-direction. The centers C2 of the pillar portions CL2 of the second column CLA2 are not located on the same straight line parallel to the X-direction. The centers C3 of the pillar portions CL3 of the third column CLA3 are not located on the same straight line parallel to the X-direction. The centers C4 of the pillar portions CL4 of the fourth column CLA4 are not located on the same straight line parallel to the X-direction. The centers C6 of the pillar portions CL6 of the sixth column CLA6 are not located on the same straight line parallel to the X-direction. The centers C7 of the pillar portions CL7 of the seventh column CLA7 are not located on the same straight line parallel to the X-direction. The centers C8 of the pillar portions CL8 of the eighth column CLA8 are not located on the same straight line parallel to the X-direction. The centers C9 of the pillar portions CL9 of the ninth column CLA9 are not located on the same straight line parallel to the X-direction.

The centers C1 of the odd-numbered pillar portions CL1 of the first column CLA1 are points which are biased in the +Y-direction from reference points located on the electrode layer WL. The centers C1 of the even-numbered pillar portions CL1 of the first column CLA1 are points which are biased in the −Y-direction from reference points located on the electrode layer WL. The centers C2 of the odd-numbered pillar portions CL2 of the second column CLA2 are points which are biased in the −Y-direction from reference points located on the electrode layer WL. The centers C2 of the even-numbered pillar portions CL2 of the second column CLA2 are points which are biased in the +Y-direction from reference points located on the electrode layer WL. The centers C3 of the odd-numbered pillar portions CL3 of the third column CLA3 are points which are biased in the +Y-direction from reference points located on the electrode layer WL. The centers C3 of the even-numbered pillar portions CL3 of the third column CLA3 are points which are biased in the −Y-direction from reference points located on the electrode layer WL. The centers C4 of the odd-numbered pillar portions CL4 of the fourth column CLA4 are points which are biased in the −Y-direction from reference points located on the electrode layer WL. The centers C4 of the even-numbered pillar portions CL4 of the fourth column CLA4 are points which are biased in the +Y-direction from reference points located on the electrode layer WL.

The centers C6 of the odd-numbered pillar portions CL6 of the sixth column CLA6 are points which are biased in the +Y-direction from reference points located on the electrode layer WL. The centers C6 of the even-numbered pillar portions CL6 of the sixth column CLA6 are points which are biased in the −Y-direction from reference points located on the electrode layer WL. The centers C7 of the odd-numbered pillar portions CL7 of the seventh column CLA7 are points which are biased in the −Y-direction from reference points located on the electrode layer WL. The centers C7 of the even-numbered pillar portions CL7 of the seventh column CLA7 are points which are biased in the +Y-direction from reference points located on the electrode layer WL. The centers C8 of the odd-numbered pillar portions CL8 of the eighth column CLA8 are points which are biased in the +Y-direction from reference points located on the electrode layer WL. The centers C8 of the even-numbered pillar portions CL8 of the eighth column CLA8 are points which are biased in the −Y-direction from reference points located on the electrode layer WL. The centers C9 of the odd-numbered pillar portions CL9 of the ninth column CLA9 are points which are biased in the −Y-direction from reference points located on the electrode layer WL. The centers C9 of the even-numbered pillar portions CL9 of the ninth column CLA9 are points which are biased in the +Y-direction from reference points located on the electrode layer WL.

The reference points for determining the locations of the pillar portions CL1 to CL4 and the pillar portions CL6 to CL9 can be set to arbitrary points on the electrode layer WL. For example, the reference points are points for disposing the pillar portions CL1 to CL4 and the pillar portions CL6 to CL9 of the first to fourth columns CLA1 to CLA4 and the sixth to ninth columns CLA6 to CLA9 on the same straight line formed parallel to the X-direction. That is, the reference points are points located on the straight lines formed along the X-direction.

The arrangement of the pillar portions CL5 will be described below.

The pillar portions CL5 of the fifth column CLA5 are located on a straight line DC parallel to the X-direction. The pillar portions CL5 are parts (dummy parts) which do not contribute to a memory operation of the semiconductor memory device 1 and the top ends thereof are not connected to the bit lines BL. That is, the pillar portions CL5 are not provided with the channel body 20A, the memory film 21A, and the core insulating portion 22A. The pillar portions CL5 may have insides filled with a predetermined film or the like or may be holes such as voids.

In this embodiment, the first to fourth columns CLA1 to CLA4 are repeatedly formed in the Y-direction with the fifth column CLA5 interposed therebetween, thereby forming the first to ninth columns CLA1 to CLA9. The pillar portions CL1 to CL4 and the pillar portions CL6 to CL9 are not disposed along the X-direction. That is, the first to fourth columns CLA1 to CLA4 and the sixth to ninth columns CLA6 to CLA9 are not formed along the X-direction.

Effects of this embodiment will be described below.

As described above in this embodiment, when the pillar portions CL1 to CL9 are arranged so as not to locate the centers C1 to C4 and the centers C6 to C9 on the straight lines parallel to the X-direction, the X-direction component of a stress such as a compressive stress or a tensile stress generated in the electrode layer WL can be interrupted. Accordingly, since the stress generated in the electrode layers WL can be reduced, it is possible to suppress the warpage of the substrate 10, thereby suppressing warpage or cracking of the wafer.

Variations of the semiconductor memory device 1 will be described below.

Fourth Embodiment

Figure 9:
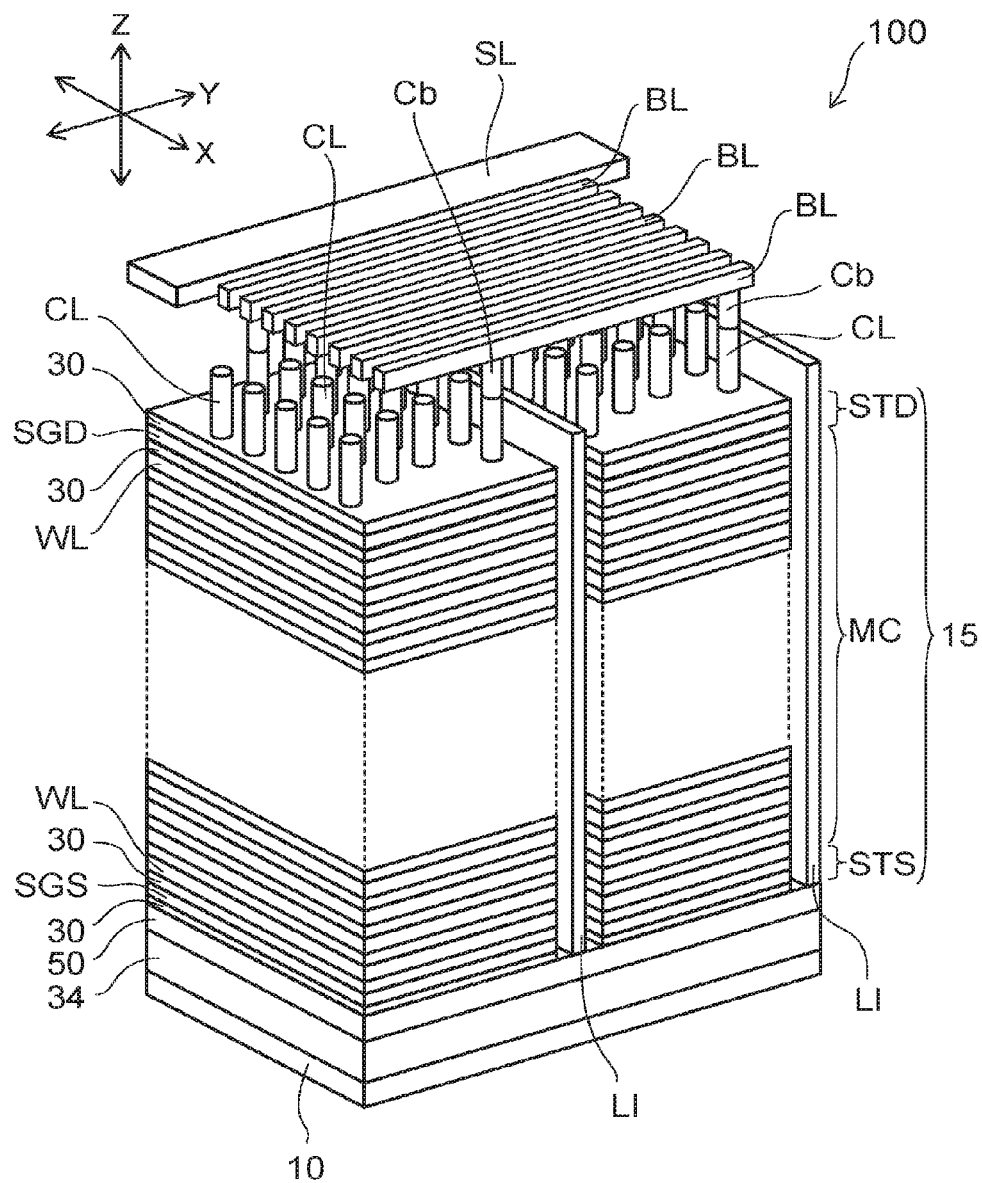
FIG. 9 is a schematic perspective view of a semiconductor memory device according to a fourth embodiment.

FIG. 9 is a schematic perspective view of a semiconductor memory device according to a fourth embodiment.

Figure 10:
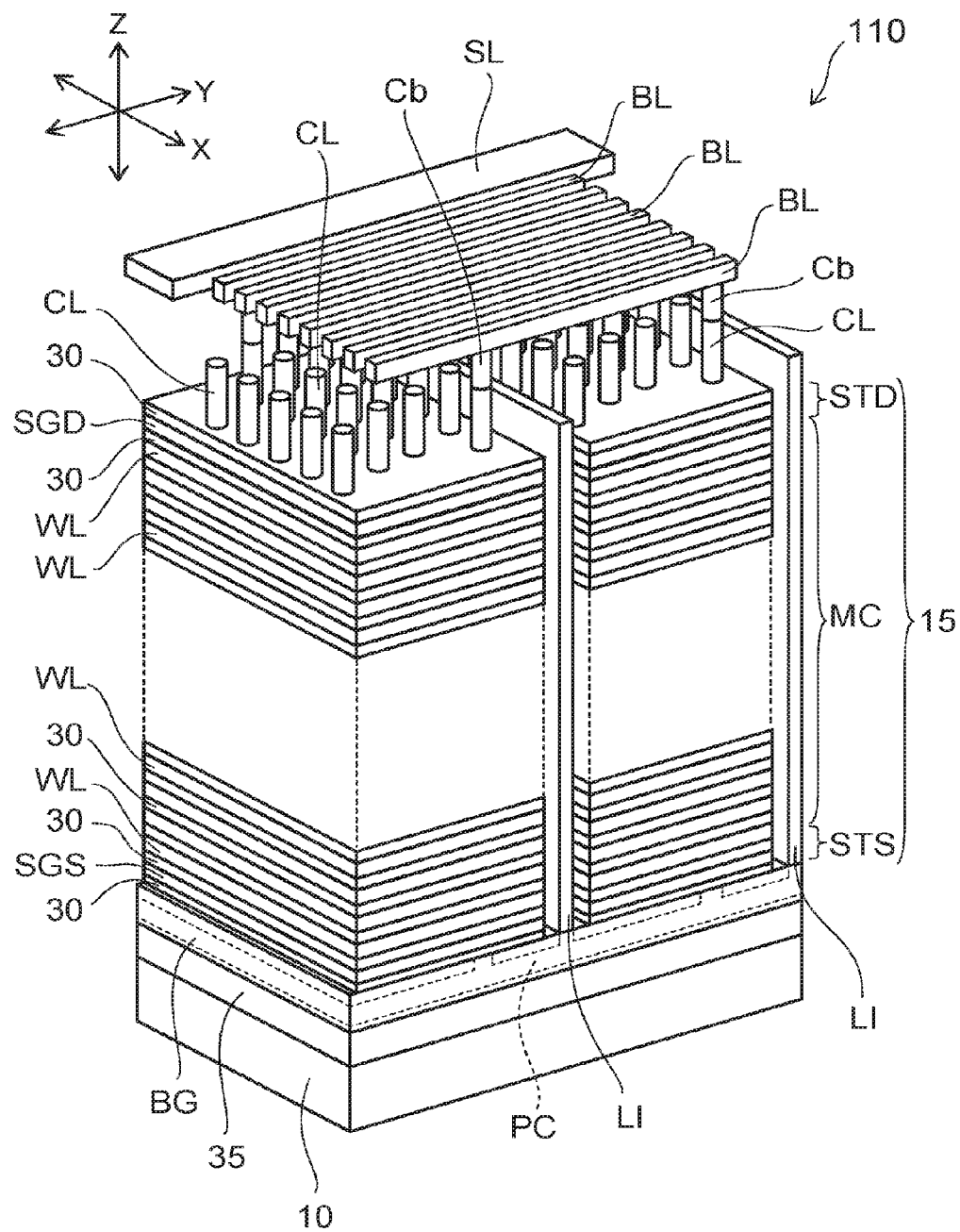
FIG. 10 is a schematic perspective view of another semiconductor memory device according to the fourth embodiment.

FIG. 10 is a schematic perspective view of another semiconductor memory device according to the fourth embodiment.

FIG. 9 and FIG. 10 are perspective views corresponding to FIG. 1 and illustrate semiconductor memory devices 100 and 110 according to variations, respectively.

As shown in FIG. 9, the semiconductor memory device 100 additionally includes a conductive layer 50 and an insulating layer 34 in comparison with the semiconductor memory device 1. The insulating layer 34 is provided on the substrate 10. Circuit elements such as interconnection layers or transistors not illustrated are provided in the insulating layer 34. The conductive layer 50 is provided on the insulating layer 34. The insulating layer 30 is provided on the conductive layer 50. The configuration above the insulating layer 30 is, for example, the same as in the semiconductor memory device 1. The interconnection portion LI is electrically connected to the pillar portions CL via the conductive layer 50.

As illustrated in FIG. 10, the semiconductor memory device 110 further includes a back gate BG on the substrate 10 with an insulating layer 35 interposed therebetween in comparison with the semiconductor memory device 1. The source-side selection gate SGS is formed on the back gate BG with the insulating layer 30 interposed therebetween.

For example, similarly to the first embodiment, each pillar portion CL includes a channel body 20A, a memory film 21A, and a core insulating portion 22A. The interconnection portion LI extends in the X-direction and the Z-direction and the bottom surface thereof is electrically connected to the pillar portions CL via a connecting portion PC provided in the back gate BG.

The connecting portion PC is provided integrally with the pillar portions CL and extends in the X-direction and the Y-direction in the back gate BG. For example, plural pillar portions CL are provided integrally with the connecting portion PC. The expression "provided integrally" refers to that a part of a material used for the pillar portions CL extends to the connecting portion PC. Accordingly, similarly to the pillar portions CL, the channel body 20A, the memory film 21A, and the core insulating portion 22A are provided in a part of the connecting portion PC.

Fifth Embodiment

Figure 11:
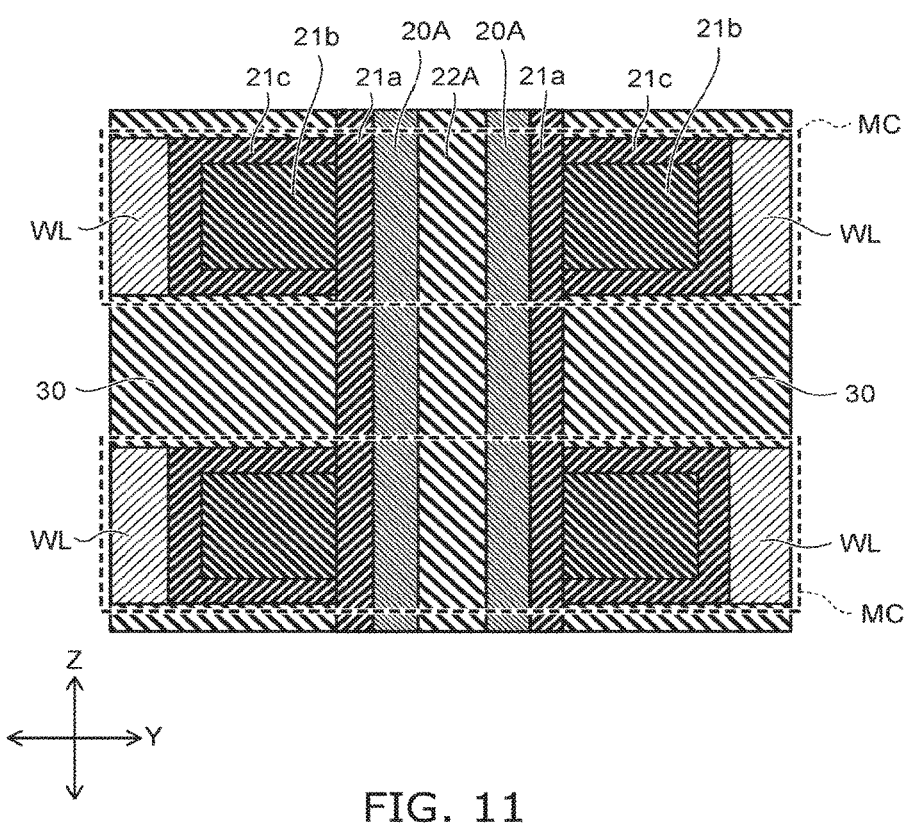
FIG. 11 is a schematic cross-sectional view of a part of a semiconductor memory device according to a fifth embodiment.

FIG. 11 is a schematic cross-sectional view of a part of a semiconductor memory device according to a fifth embodiment.

FIG. 11 is a cross-sectional view corresponding to FIG. 3 and illustrates a part of a semiconductor memory device 120 according to a variation.

As shown in FIG. 11, plural charge storage layers 21b may be provided in each memory cell MC (that is, each electrode layer WL). Each of the charge storage layers 21b is stacked via the insulating layer 30. For example, the charge storage layers 21b may contain a semiconductor material such as silicon.

Plural block insulating layers 21c may be provided as the charge storage layers 21b. Each of block insulating layers 21c is provided between each electrode layer WL and each charge storage layer 21b and between the insulating layer 30 and each charge storage layer 21b.

A method of fabricating the semiconductor memory device according to the embodiments will be described below.

First, a stacked body in which an insulating layer 30 and a sacrificing layer are alternately stacked is formed on a substrate 10 which is a part of a wafer, and then plural memory holes penetrating the stacked body and reaching the substrate 10 are formed. The plural memory holes are formed, for example, using a reactive ion etching (RIE) method. For example, the plural memory holes are formed so as not to dispose the neighboring memory holes along the X-direction using a predetermined mask.

Then, a memory film 21A, a channel body 20A, and a core insulating portion 22A are sequentially formed in each memory hole. As a result, the pillar portions CL are formed.

Then, slits are formed in the stacked body. Subsequently, the sacrificing layer is removed via the slits and then a conductive layer is formed in the voids from which the sacrificing layer is removed. Accordingly, the stacked body 15 including plural electrode layers WL, plural insulating layers 30, a source-side selection gate SGS, and a drain-side selection gate SGD is formed.

Then, an insulating film 40 is formed in the slits and then a conductive film is formed thereon. Accordingly, the interconnection portions LI are formed. For example, the pillar portions CL1 to CL4 are disposed between the interconnection portions LI. The pillar portions CL1 to CL4 are not disposed along the X-direction.

Then, contact portions Cb and V1 are formed on the pillar portions CL and then bit lines BL are formed thereon. Thereafter, the wafer and the structure formed thereon are diced and segmented into plural semiconductor memory devices 1.

In this way, the semiconductor memory device 1 according to this embodiment is fabricated.

According to the above-mentioned embodiments, it is possible to implement a semiconductor memory device which can reduce a stress generated in the electrode layers.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
a substrate;
a stacked body that is provided on the substrate and includes a plurality of electrode layers stacked separately from each other;
a plurality of pillar portions that are provided in the stacked body and extend in a stacking direction of the stacked body; and
an interconnection portion that is provided in the stacked body and extends in a first direction,
centers of the plurality of pillar portions being deviated in a second direction intersecting the first direction or a third direction opposite to the second direction intersecting the first direction with respect to a plurality of reference points,
the plurality of reference points including a plurality of first reference points, a plurality of second reference points located in the second direction from the plurality of first reference points, a plurality of third reference points located in a fourth direction which is inclined by a first angle about the second direction from the plurality of first reference points, and a plurality of fourth reference points located in a fifth direction which is inclined by the first angle about the third direction from the plurality of first reference points,
when a virtual first straight line, a virtual second straight line, a virtual third straight line, and a virtual fourth straight line which extend in the first direction are set, the plurality of first reference points, the plurality of second reference points, the plurality of third reference points, and the plurality of fourth reference points being located on virtual the first straight line, the virtual second straight line, the virtual third straight line, and the virtual fourth straight line, respectively,
the plurality of pillar portions being disposed along a plurality of columns and including first pillar portions, second pillar portions, third pillar portions, fourth pillar portions, fifth pillar portions, sixth pillar portions, seventh pillar portions and eighth pillar portions,
the plurality of columns including a first column, a second column adjacent to the first column in the second direction, a third column adjacent to the second column in the second direction, and a fourth column adjacent to the third column in the second direction,
the centers of the first pillar portions of the first column being deviated in the second direction with respect to the fourth reference points, and the centers of the second pillar portions of the first column adjacent to the first pillar portions of the first column being deviated in the third direction with respect to the fourth reference points,
the centers of the third pillar portions of the second column being deviated in the third direction with respect to the first reference points, and the centers of the fourth pillar portions of the second column adjacent to the third pillar portions of the second column being deviated in the second direction with respect to the first reference points, the centers of the fifth pillar portions of the third column being deviated in the second direction with respect to the third reference points, and the centers of the sixth pillar portions of the third column adjacent to the fifth pillar portions of the third column being deviated in the third direction with respect to the third reference points, and the centers of the seventh pillar portions of the fourth column being deviated in the third direction with respect to the second reference points, and the centers of the eighth pillar portions of the fourth column adjacent to the seventh pillar portions of the fourth column being deviated in the second direction with respect to the second reference points.

2. The device according to claim 1, wherein the first angle is 30 degrees.

3. The device according to claim 1, wherein the plurality of reference points are intersections of lattice bodies.

4. The device according to claim 1, further comprising a first interconnection that is provided on the plurality of pillar portions and extends in the second direction, wherein the plurality of columns include a fifth column adjacent to the fourth column in the second direction, and the plurality of pillar portions of the fifth column are not connected to the first interconnection.

5. The device according to claim 1, wherein each of the plurality of pillar portions includes a semiconductor portion and a memory film provided between the semiconductor portion and the stacked body.

6. The device according to claim 1, further comprising a first interconnection that is provided on the plurality of pillar portions and extends in the second direction.

7. A semiconductor memory device comprising:
a substrate;
a stacked body that is provided on the substrate and includes a plurality of electrode layers stacked separately from each other;
a plurality of pillar portions that are provided in the stacked body and extend in a stacking direction of the stacked body; and
an interconnection portion that is provided in the stacked body and extends in a first direction,
when a virtual first straight line, a virtual second straight line, a virtual third straight line, and a virtual fourth straight line that extend in the first direction are set, the plurality of pillar portions including a plurality of first pillar portions disposed on the virtual first straight line, a plurality of second pillar portions disposed on the virtual second straight line, a plurality of third pillar portions disposed on the virtual third straight line, and a plurality of fourth pillar portions disposed on the virtual fourth straight line, the virtual first straight line, the virtual second straight line, the virtual third straight line, and the virtual fourth straight line being sequentially arranged in a second direction intersecting the first direction, and a distance between the second pillar portion and the third pillar portion in the neighboring pillar portions being less than a distance between the first pillar portion and the second pillar portion.

8. The device according to claim 7, wherein when a virtual fifth straight line, a virtual sixth straight line, a virtual seventh straight line, and a virtual eighth straight line that extend in the first direction are set, the plurality of pillar portions include a plurality of fifth pillar portions disposed on the virtual fifth straight line, a plurality of sixth pillar portions disposed on the virtual sixth straight line, a plurality of seventh pillar portions disposed on the virtual seventh straight line, and a plurality of eighth pillar portions disposed on the virtual eighth straight line, the virtual first straight line, the virtual second straight line, the virtual third straight line, the virtual fourth straight line, the virtual fifth straight line, the virtual sixth straight line, the virtual seventh straight line, and the virtual eighth straight line are sequentially arranged in the second direction, and a distance between the sixth pillar portion and the seventh pillar portion in the neighboring pillar portions is less than a distance between the fifth pillar portion and the sixth pillar portion.

9. The device according to claim 8, wherein a distance between the fourth pillar portion and the fifth pillar portion in the neighboring pillar portions is less than a distance between the third pillar portion and the fourth pillar portion.

10. The device according to claim 8, wherein a distance between the fourth pillar portion and the fifth pillar portion in the neighboring pillar portions is less than a distance between the fifth pillar portion and the sixth pillar portion.

\* \* \* \* \*